United States Patent
Shih (10) Patent No.: US 9,653,435 B2
(45) Date of Patent: May 16, 2017

(54) LIGHT EMITTING DIODE (LED) PACKAGE HAVING SHORT CIRCUIT (VLED) DIE, LENS SUPPORT DAM AND SAME SIDE ELECTRODES AND METHOD OF FABRICATION

(71) Applicant: SemiLEDS Optoelectronics Co, Ltd.

(72) Inventor: Yi-Feng Shih, Toufen Township (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 14/798,517

(22) Filed: Jul. 14, 2015

(65) Prior Publication Data

US 2017/0018537 A1 Jan. 19, 2017

(51) Int. Cl.
| | |
|---|---|
| *H01L 25/075* | (2006.01) |
| *H01L 33/06* | (2010.01) |
| *H01L 33/32* | (2010.01) |
| *H01L 33/62* | (2010.01) |
| *H01L 33/60* | (2010.01) |
| *H01L 33/58* | (2010.01) |
| *H01L 33/44* | (2010.01) |

(52) U.S. Cl.
CPC .......... *H01L 25/0753* (2013.01); *H01L 33/06* (2013.01); *H01L 33/32* (2013.01); *H01L 33/44* (2013.01); *H01L 33/58* (2013.01); *H01L 33/60* (2013.01); *H01L 33/62* (2013.01); *H01L 2933/0058* (2013.01); *H01L 2933/0066* (2013.01)

(58) Field of Classification Search
CPC ......... H01L 33/06; H01L 33/32; H01L 33/62; H01L 33/60; H01L 33/58; H01L 33/44; H01L 25/0753; H01L 2933/0058; H01L 2933/0066

See application file for complete search history.

(56) References Cited

U.S. PATENT DOCUMENTS

| | | | |
|---|---|---|---|
| 7,846,755 B2 | 12/2010 | Kal et al. | |
| 8,283,652 B2 | 10/2012 | Chu et al. | |
| 8,283,693 B2* | 10/2012 | Lee | .......... H01L 33/58 257/100 |
| 8,546,818 B2 | 10/2013 | Liu et al. | |
| 8,703,515 B2 | 4/2014 | Liu et al. | |
| 8,723,160 B2 | 5/2014 | Chu et al. | |
| 2005/0270493 A1* | 12/2005 | Nakamura | ........... H04N 9/3144 353/31 |
| 2010/0320483 A1 | 12/2010 | Kadotani et al. | |
| 2013/0062640 A1* | 3/2013 | Yen | .......... H01L 33/50 257/98 |
| 2013/0279169 A1* | 10/2013 | Reiherzer | ............. F21V 19/001 362/249.02 |
| 2014/0070164 A1* | 3/2014 | Doan | ...................... H01L 33/04 257/13 |
| 2014/0154821 A1 | 6/2014 | Chu et al. | |

\* cited by examiner

*Primary Examiner* — Galina Yushina
(74) *Attorney, Agent, or Firm* — Stephen A. Gratton (57) ABSTRACT

A light emitting diode (LED) package includes a main vertical LED (VLED) die; a short circuit VLED die; a lens support dam; a transparent lens attached to the lens support dam; a first electrode in electrical communication with a first semiconductor layer of the main VLED die and a second electrode in electrical communication with a second semiconductor layer of the main VLED die.

13 Claims, 13 Drawing Sheets

LIGHT EMITTING DIODE (LED) PACKAGE HAVING SHORT CIRCUIT (VLED) DIE, LENS SUPPORT DAM AND SAME SIDE ELECTRODES AND METHOD OF FABRICATION

FIELD

This disclosure relates generally to light emitting diode (LED) packages and particularly to a light emitting diode (LED) package having a short circuit (VLED) die, a lens support dam and same side electrodes, and to a method for fabricating the light emitting diode (LED) package.

BACKGROUND

Figure 1A:
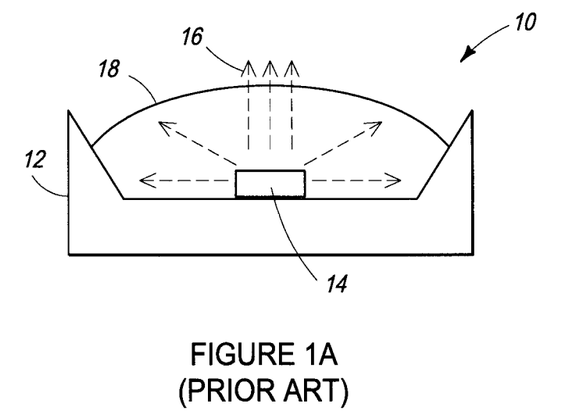
FIG. 1A is a schematic cross sectional view of a prior art light emitting diode (LED) package.

A prior art light emitting diode (LED) package 10 is shown in FIG. 1A. The (LED) package 10 includes a package substrate 12 and a light emitting diode (LED) die 14 mounted to the package substrate 12 configured to emit electromagnetic radiation 16, such as light rays having a desired wavelength. The (LED) die 14 can comprise a vertical light emitting diode (VLED) die, a horizontal light emitting diode (LED) die or a flip chip light emitting diode die (FCLED). In addition, the (LED) die 14 can wire bonded to the package substrate 12 or flip chip mounted to the package substrate 12. The (LED) package 10 also includes a lens 18 typically formed of a molded plastic material, such as epoxy or silicone, configured to cover and protect the (LED) die 14. One problem with the (LED) package 10 is that the molded plastic lens 18 tends to degrade with time and to absorb the electromagnetic radiation 16, particularly UV radiation. Another problem is that with a wire bonded (LED) die, the wire bonding between the (LED) die 14 and the package substrate 12 tends to have defects and can also degrade with time.

Figure 1B:
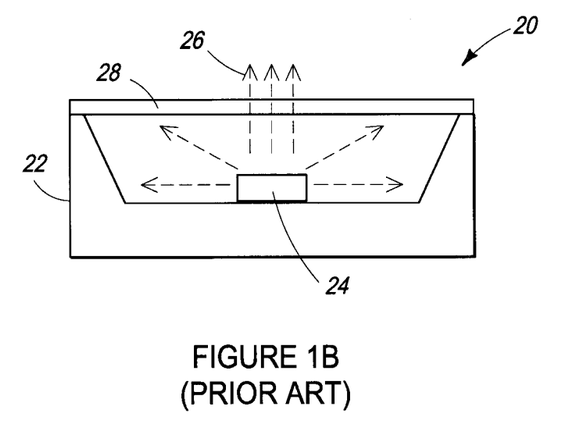
FIG. 1B is a schematic cross sectional view of another prior art light emitting diode (LED) package.

Another prior art light emitting diode (LED) package 20 is shown in FIG. 1B. The (LED) package 20 includes a package substrate 22 and a light emitting diode (LED) die 24 mounted to the package substrate 22 configured to emit electromagnetic radiation 26. The (LED) die 24 can comprise a vertical light emitting diode (VLED) die, a horizontal light emitting diode (LED) die or a flip chip light emitting diode die (FCLED), which can be wire bonded or flip chip mounted to the package substrate 22. In this case, a glass lens 28 attaches to the package substrate 22 and protects the (LED) die 24. The glass lens 28 does not degrade as with the molded plastic lens 18 (FIG. 1A) but can be more expensive to manufacture as it requires additional elements, such as an attaching adhesive and an encapsulant for the (LED) die 24. Wire bonding of the (LED) die 24 to the package substrate 22 can also produce defects and can degrade with usage.

The present disclosure is directed to a light emitting diode (LED) package having a lens support dam for supporting a transparent lens. The lens support dam permits the lens to be made of a non-degrading material, such as glass or quartz, without the requirement of additional elements and expensive manufacturing steps. The light emitting diode (LED) package also includes same side electrodes, which permit the (LED) package to be mounted to a circuit board using a chip-on-board semiconductor assembly technique without wire bonding. This improves the reliability and provides a smaller footprint for the (LED) package.

However, the foregoing examples of the related art and limitations related therewith are intended to be illustrative and not exclusive. Other limitations of the related art will become apparent to those of skill in the art upon a reading of the specification and a study of the drawings. Similarly, the following embodiments and aspects thereof are described and illustrated in conjunction with a flip chip light emitting diode (FCLED) die which are meant to be exemplary and illustrative, not limiting in scope.

SUMMARY

A light emitting diode (LED) package includes a main (VLED) die, and a short circuit (VLED) die. Each die includes an epitaxial stack having a first semiconductor layer, a multiple quantum well (MQW) layer, and a second semiconductor layer. The light emitting diode (LED) package also includes a conductive strap and a conductive via configured to electrically connect the second semiconductor layer of the main (VLED) die to the first semiconductor layer of the short circuit (VLED) die.

The light emitting diode (LED) package also includes a lens support dam, and a transparent lens attached to the lens support dam. The lens support dam can be formed from the same epitaxial stack as the main (VLED) die and the short circuit (VLED) die. In addition, a spacer via electrically isolates the lens support dam from the main (VLED) die and the short circuit (VLED) die. The light emitting diode (LED) package also includes a first electrode in electrical communication with the first semiconductor layer of the main (VLED) die and a second electrode in electrical communication with the second semiconductor layer of the main (VLED) die. Shorting of the semiconductor layers by the short circuit vertical (VLED) die permits the electrodes to be located on the same side of the light emitting diode (LED) package, such that chip-on-board semiconductor techniques can be used to mount the light emitting diode (LED) package to a circuit board. The light emitting diode (LED) package also includes a first reflecting layer between the main (VLED) die and the first electrode, and a second reflecting layer between the short circuit (VLED) die and the second electrode.

A method for fabricating the light emitting diode (LED) package includes the steps of: forming an epitaxial stack having a first semiconductor layer, a multiple quantum well layer and a second semiconductor layer; and patterning the epitaxial stack to form a main (VLED) die, a short circuit (VLED) die and a lens support dam. The method also includes the steps of forming a conductive strap and a conductive via between the main (VLED) die and the short circuit (VLED) die to electrically connect the second semiconductor layer of the main (VLED) die to the first semiconductor layer of the short circuit (VLED) die; forming a first electrode in electrical contact with the first semiconductor layer of the main (VLED) die; forming a second electrode in electrical contact with the second semiconductor layer of the main (VLED) die; and attaching a lens to the lens support dam.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

FIG. 5A-1 is an enlarged schematic bottom view, equivalent to FIG. 5A, illustrating the light emitting diode (LED) package with an alternate embodiment curved middle segment of a surface isolator structure;

FIG. 5B-1 is an enlarged schematic bottom view, equivalent to FIG. 5B, illustrating the light emitting diode (LED) package with an alternate embodiment curved conductive via;

FIG. 5C-1 is an enlarged schematic bottom view, equivalent to FIG. 5C, illustrating the light emitting diode (LED) package with the alternate embodiment curved conductive via.

DETAILED DESCRIPTION OF THE PREFERRED EMBODIMENTS

In the description to follow, (VLED) refers to a vertical light emitting diode and (LED) refers to a light emitting diode. Also, when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Figure 2:
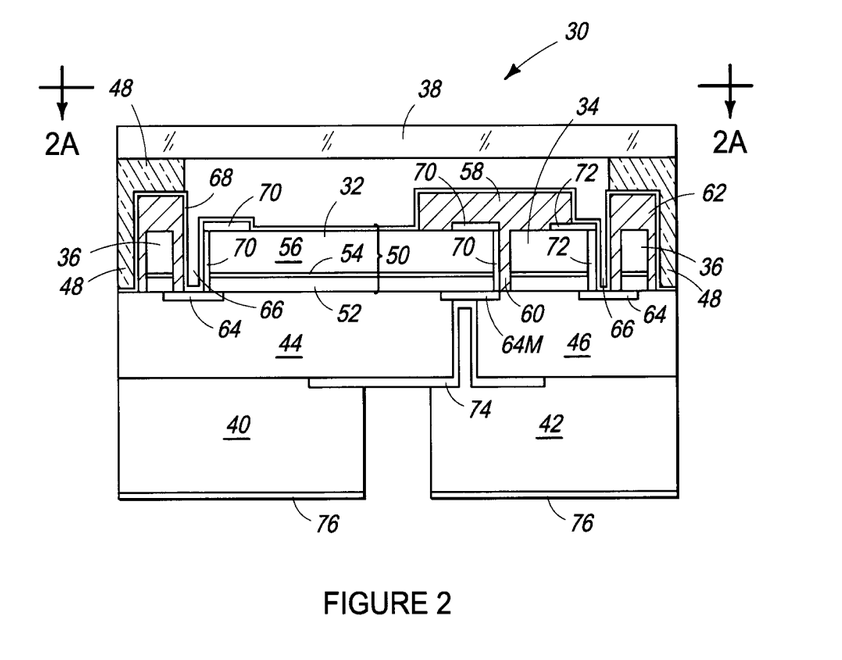
FIG. 2 is an enlarged schematic cross sectional view of a light emitting diode (LED) package having a short circuit (VLED) die, a lens support dam and same side electrodes.

Referring to FIG. 2, a light emitting diode (LED) package 30 is illustrated. For simplicity, various elements of the light emitting diode (LED) package 30 are not illustrated in all of the figures. The light emitting diode (LED) package 30 includes a main (VLED) die 32; and a short circuit (VLED) die 34. The light emitting diode (LED) package 30 also includes a lens support dam 36, a transparent lens 38 attached to the lens support dam 36; and an adhesion layer 48 for attaching the transparent lens 38 to the lens support dam 36.

The light emitting diode (LED) package 30 also includes a first electrode 40 in electrical communication with the main (VLED) die 32 and a second electrode 42 in electrical communication with the main (VLED) die 32 via the short circuit (VLED) die 34. The light emitting diode (LED) package 30 also includes a first reflecting layer 44 between the main (VLED) die 32 and the first electrode 40, and a second reflecting layer 46 between the short circuit (VLED) die 34 and the second electrode 42.

The main (VLED) die 32, the short circuit (VLED) die 34 and the lens support dam 36 are all formed of the same epitaxial stack 50. The epitaxial stack 50 includes a first semiconductor layer 52, a multiple quantum well (MQW) layer 54, and a second semiconductor layer 56.

In the main (VLED) die 32, the first semiconductor layer 52 is configured as a first confinement layer, the multiple quantum well (MQW) layer 54 is configured to emit electromagnetic radiation, and the second semiconductor layer 56 is configured as a second confinement layer. For example, the first semiconductor layer 52 can comprise a p-type confinement layer and the second semiconductor layer 56 can comprise an n-type confinement layer, or vice versa. For a p-type confinement layer, the first semiconductor layer 52 can comprise p-GaN, p-AlGaN, p-InGaN, p-AlInGaN, p-AlInN and p-AlN. For an n-type confinement layer, the second semiconductor layer 56 can comprise n-GaN, n-AlGaN, n-InGaN, n-AlInGaN, AlInN and n-AlN. The multiple quantum well (MQW) layer 54 can comprise one or more quantum wells comprising one or more layers of InGaN/GaN, AlGaInN, AlGaN, AlInN and AN. The multiple quantum well (MQW) layer 54 can be configured to emit electromagnetic radiation from the non-visible or visible spectral region (e.g., 200-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm).

In the short circuit (VLED) die 34, the epitaxial stack 50 performs an electrical function but not an electromagnetic emitting function. In particular, the second semiconductor layer 56 of the main (VLED) die 32 is electrically connected via a conductive strap 58 and a conductive via 60 to the first semiconductor layer 52 of the short circuit (VLED) die 34. The first semiconductor layer 52 of the short circuit (VLED) die 34 is also electrically connected to the second electrode 42 via the second reflecting layer 46. On the other hand, the first electrode 40 is electrically connected to the first semiconductor layer 52 of the main (VLED) die 32 via the first reflecting layer 44. The first electrode 40 thus receives its polarity from the first semiconductor layer 52, which in the illustrative embodiment can comprise a p-polarity.

The short circuit (VLED) die 34 allows the first electrode 40 and the second electrode 42 to be formed on the same side of the light emitting diode (LED) package 30. In addition, the first reflecting layer 44 provides an electrical path between the main (VLED) die 32 and the first electrode 40, while the second reflecting layer 46 provides an electrical path between the short circuit (VLED) die 34 and the second electrode 42. The first reflecting layer 44 and the second reflecting layer 46 also function to reflect the electromagnetic radiation emitted by the main (VLED) die 32.

Figure 2A:
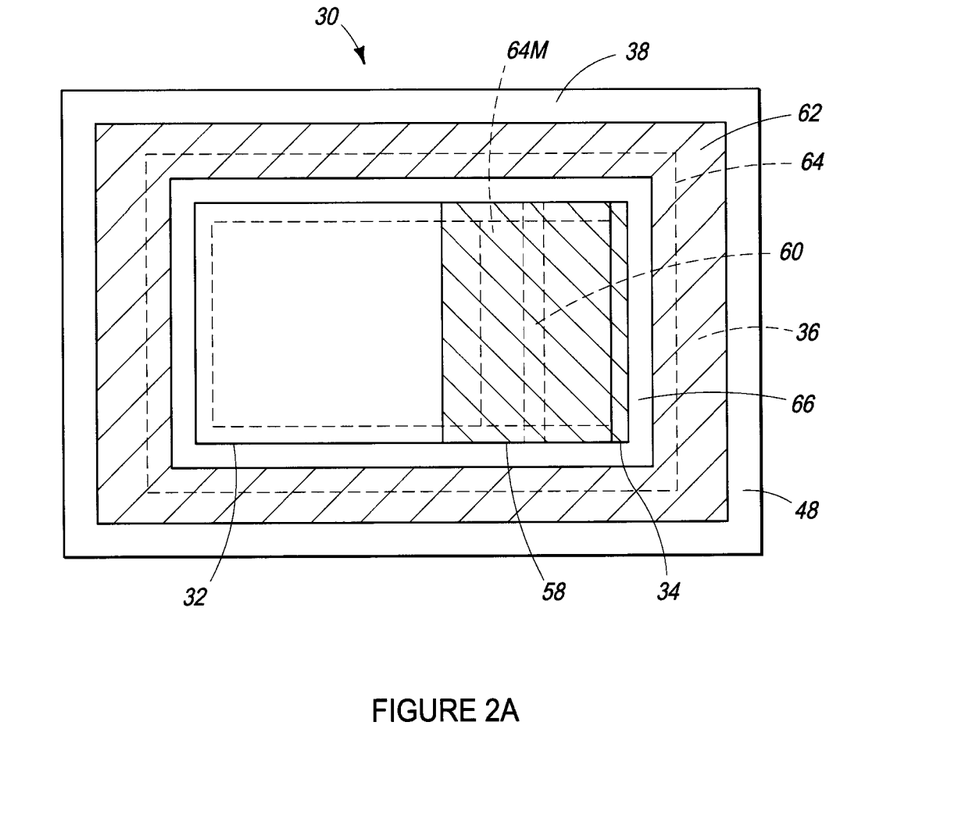
FIG. 2A is an enlarged schematic plan view taken along line 2A-2A of FIG. 2.

In the lens support dam 36, the first semiconductor layer 52, the multiple quantum well (MQW) layer 54, and the second semiconductor layer 56 perform a structural function but no electrical function. In particular, as shown in FIG. 2A, the lens support dam 36 has a peripheral outline that matches, but is slightly smaller than, the peripheral outline (i.e., footprint) of the light emitting diode (LED) package 30. This structure provides support for the lens 38, which can have a peripheral outline that exactly matches the peripheral outline (i.e., footprint) of the light emitting diode (LED) package 30. The lens 38 can comprise a transparent material, such as glass, quartz or a patternable film material. As shown in FIG. 2, the adhesion layer 48 can be formed on the lens support dam 36 and along the outside edge of the light emitting diode (LED) package 30. The adhesion layer 48 can comprise an adhesive such as silicone, epoxy, acrylic, spin-on-glass or a pressure sensitive adhesive (PSA).

As shown in FIG. 2, the lens support dam 36 can have further structure in the form of a lens support metal layer 62. The lens support metal layer 62 can comprise a same metal as the conductive strap 58, and can be formed using the same deposition process. The lens support metal layer 62 can cover the sides and upper surface of the lens support dam 36 and can have a peripheral outline that matches, but is slightly larger than the peripheral outline of the portion of the epitaxial stack 50 that forms the lens support dam 36.

As also shown in FIG. 2, a surface isolator structure 64 is formed on the first reflection layer 44 and on the second reflection layer 46. As shown in FIG. 2A, the surface isolator structure 64 can have a picture-frame outline, with an outside edge that is subjacent to the interior of the lens support dam 36, and an inside edge that is subjacent to the outside edges of the main (VLED) die 32 and the short circuit (VLED) die 34. In addition, a middle segment 64M of the surface isolator structure 64 can be configured to isolate surfaces along the interior edge of the main (VLED) die 32 proximate to the interior edge of the short circuit (VLED) die 34. The surface isolator structure 64 can comprise an electrically insulating material, such as an oxide (e.g., $SiO_2$, $TiO_2Al_2O_3$, $HfO_2$, $Ta_2O_5$), a polymer (e.g., epoxy, parylene, polyimide), a nitride (e.g. $Si_3N_4$), a photoresist (e.g., EPON Resin Su-8), or a glass (e.g., BPSG borophosphosilicate glass).

As shown in FIG. 2A, a picture frame shaped spacer via 66 spaces the lens support dam 36 from the outside edges of the main (VLED) die 32 and the short circuit (VLED) die 34. In addition, a passivation layer 68 is formed on all surfaces of the lens support dam 36, in the spacer via 66, on the top surface of the main (VLED) die 32, on the conductive strap 58 and on the top surface of the short circuit (VLED) die 34. The passivation layer 68 can comprise an electrically insulating material, such as an oxide (e.g., $SiO_2$, $TiO_2Al_2O_3$, $HfO_2$, $Ta_2O_5$), a polymer (e.g., epoxy, parylene, polyimide), a nitride (e.g. $Si_3N_4$), a photoresist (e.g., EPON Resin Su-8), or a glass (e.g., BPSG borophosphosilicate glass).

As shown in FIG. 2, a main (VLED) die isolator structure 70 is formed along the edges and top surface of the main (VLED) die 32. In addition, a short circuit (VLED) die isolator structure 72 is formed along an outside edge and top surface of the short circuit (VLED) die 34, which is proximate to the spacer via 66 and the inside surface of the lens support dam 36. The main (VLED) die isolator structure 70, the short circuit (VLED) die isolator structure 72 and an electrode isolator structure 74 can comprise an electrically insulating material, such as an oxide (e.g., $SiO_2$, $TiO_2Al_2O_3$, $HfO_2$, $Ta_2O_5$), a polymer (e.g., epoxy, parylene, polyimide), a nitride (e.g. $Si_3N_4$), a photoresist (e.g., EPON Resin Su-8), or a glass (e.g., BPSG borophosphosilicate glass).

As shown in FIG. 2, the first electrode 40 and the second electrode 42 each have an outer protection layer 76. The first electrode 40 and the second electrode 42 can comprise a metal alloy or a metal stack, such as at least two metals selected from the group consisting of Cu, Ni, Al, Sn, Co, W, Mo, V, Au, Pd, Pt, Ti, Rh, Cu—W, TaN, TiW, Cr, Cu—Mo, NiV and alloys thereof. The protection layer 76 can comprise a metal alloy a metallic material or a metal stack, such as at least two metals selected from the group consisting of Cu, Ni, Al, Sn, Co, W, Mo, V, Au, Pd, Pt, Ti, Rh, Cu—W, TaN, TiW, Cu—Mo, Mo, NiV, AuSn, SnCu and alloys thereof. The first reflecting layer 44 and the second reflecting layer 46 can comprise a metal alloy or a metal stack, such as at least two metals selected from the group consisting of Cu, Ni, Al, Sn, Co, Ag, W, Mo, V, Au, Pd, Pt, Ti, Rh, TaN, TiW, Cr, NiV, Cu—Cu, Cu—W, Cu—Mo and alloys thereof. The conductive strap 58 and the lens support metal layer 62 can comprise a metal alloy or a metal stack, such as at least two metals selected from the group consisting of Cu, Ni, Al, Sn, Co, W, V, Au, Pd, Pt, Ti, Rh, TaN, TiW, Cr, Mo, NiV and alloys thereof.

Figure 2B:
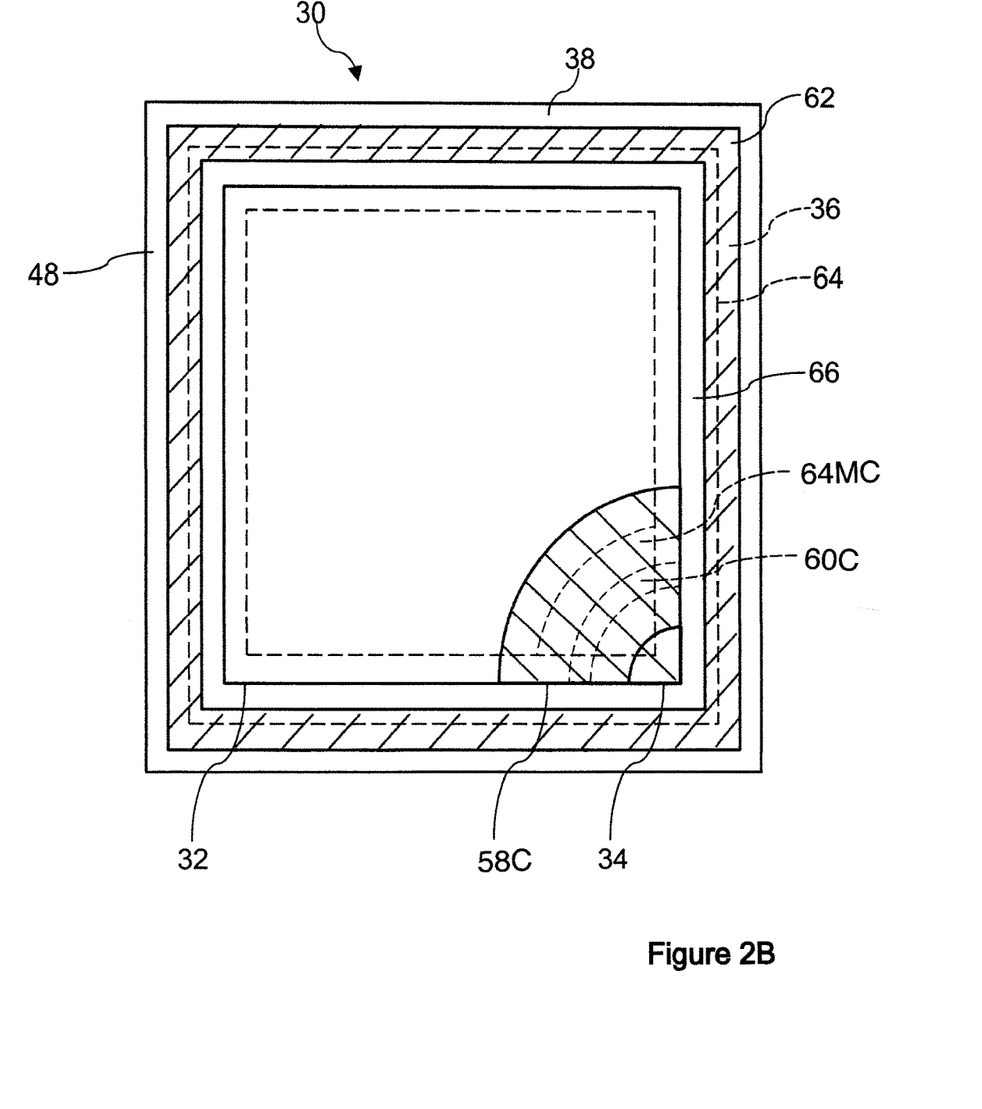
FIG. 2B is an enlarged schematic plan, equivalent to FIG. 2A, illustrating the light emitting diode (LED) package with an alternate embodiment curved conductive strap.

As shown in FIG. 2A, the light emitting diode (LED) package 30 can have a desired peripheral shape and a footprint that provides a vertical chip scale package. For example, the light emitting diode (LED) package 30 can have a square or a rectangular peripheral shape of from at least 100 μm on a side (S). However, this shape and size is by way of example and other polygonal, circular and oval shapes can be employed. The construction of the lens support dam 36 allows the footprint to be smaller than with the prior art light emitting diode (LED) package 10 (FIG. 1A) and 20 (FIG. 1B). As shown in FIG. 2B, an alternate embodiment conductive strap 58C can have a curved configuration with a radius of curvature and width, which matches that of a curved conductive via 60C.

Figure 3:
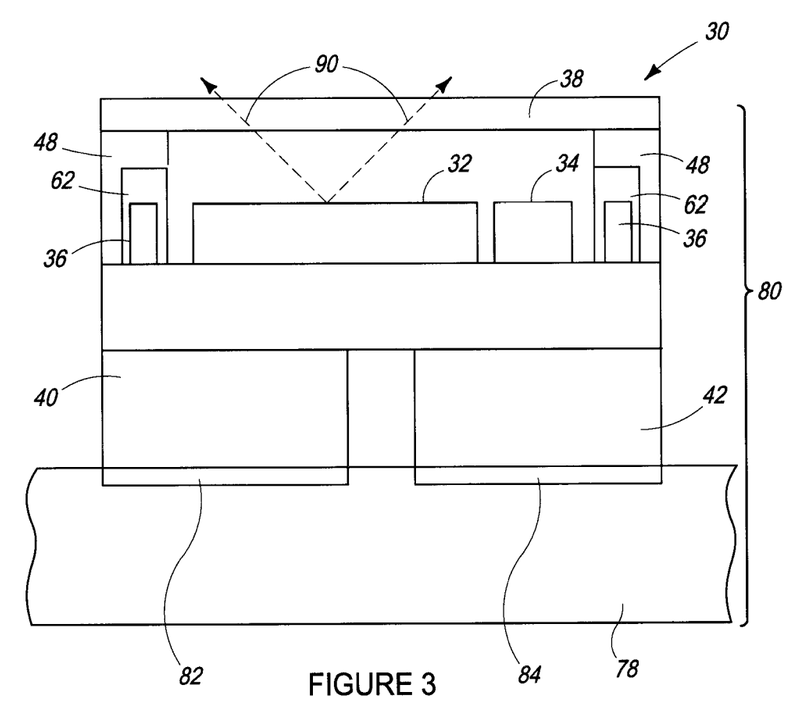
FIG. 3 is a schematic side elevation view of the light emitting diode (LED) package mounted to a module substrate.

As shown in FIG. 3, the light emitting diode (LED) package 30 can be flip chip mounted to a board 78, such as a circuit board or module substrate, to form a (LED) system 80. During a flip chip bonding process, the first electrode 40 can be bonded to a first electrode pad 82 on the board 78 to provide an anode and the second electrode 42 can be bonded to a second electrode pad 84 on the module substrate 78 to provide a cathode. Suitable bonding processes include soldering, reflow or conductive adhesive bonding. The main (VLED) die 32 emits electromagnetic radiation 90 that passes through the lens 38, which is supported by the lens support dam 36.

Figure 4A:
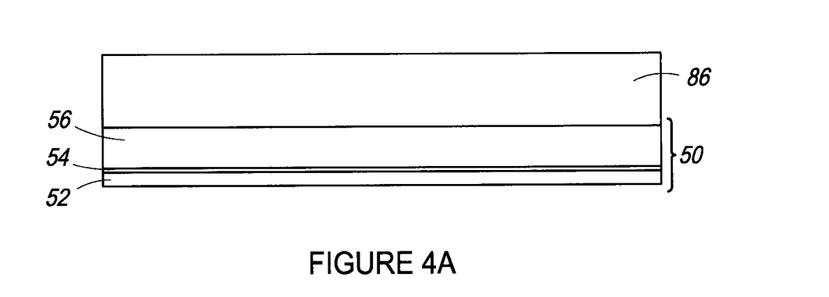
FIGS. 4A-4F are schematic cross sectional views illustrating steps in a method for fabricating the light emitting diode (LED) package.

Referring to FIGS. 4A-4F, steps in a method for fabricating the light emitting diode (LED) package 30 are illustrated. Initially, as shown in FIG. 4A, a carrier substrate 86 can be provided. The carrier substrate 86 can be in the form of a wafer comprised of a suitable material, such as sapphire, GaN, silicon carbide (SiC), silicon, AN, germanium, zinc oxide (ZnO), or gallium arsenide (GaAs), such that a wafer level fabrication method can be performed to form a plurality of the light emitting diode (LED) packages 30.

As also shown in FIG. 4A, the multi-layer epitaxial stack 50 can be formed on the carrier substrate 86 using a suitable deposition process such as vapor phase epitaxy (VPE), molecular beam epitaxy (MBE) or liquid phase epitaxy (LPE). The multi layer epitaxial stack 50 includes first semiconductor layer 52, the multiple quantum well (MQW) layer 54, and the second semiconductor layer 56. The main (VLED) die 32 will be formed from a first portion of the epitaxial stack 50. The short circuit (VLED) die 34 will be formed from a second portion of the epitaxial stack 50. The lens support dam 36 will be formed from a third portion of the epitaxial stack 50.

Figure 4B:
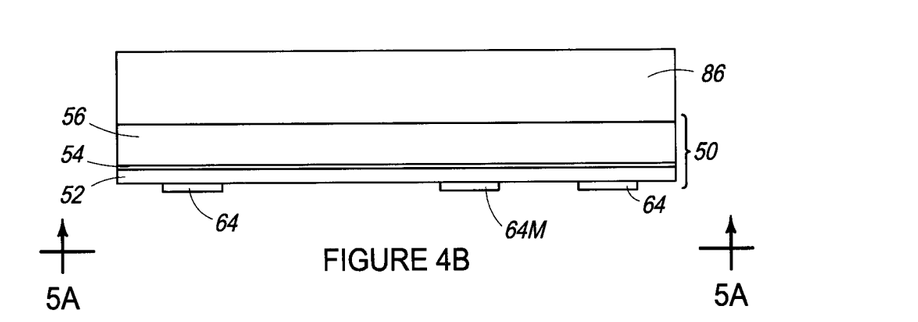
Figure 5A:
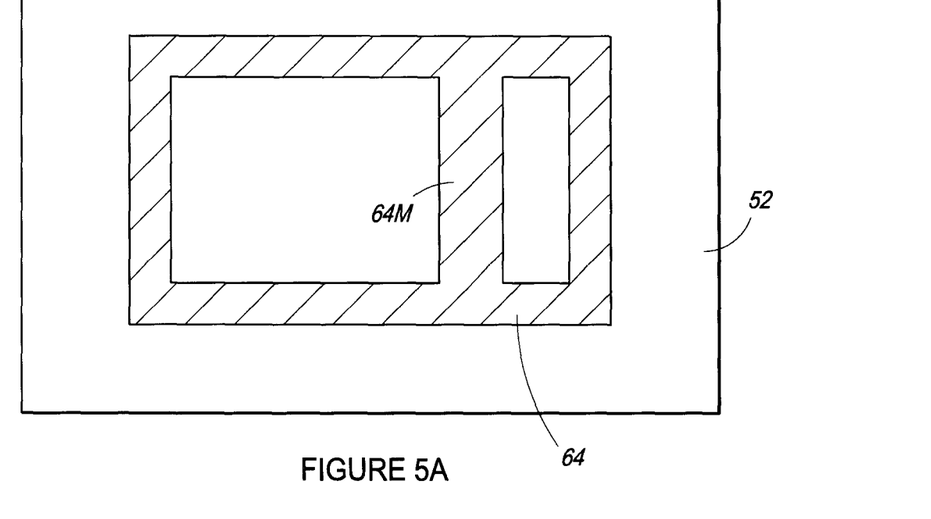
FIG. 5A is an enlarged schematic bottom view taken along line 5A-5A of FIG. 4B.
Figure 5A:
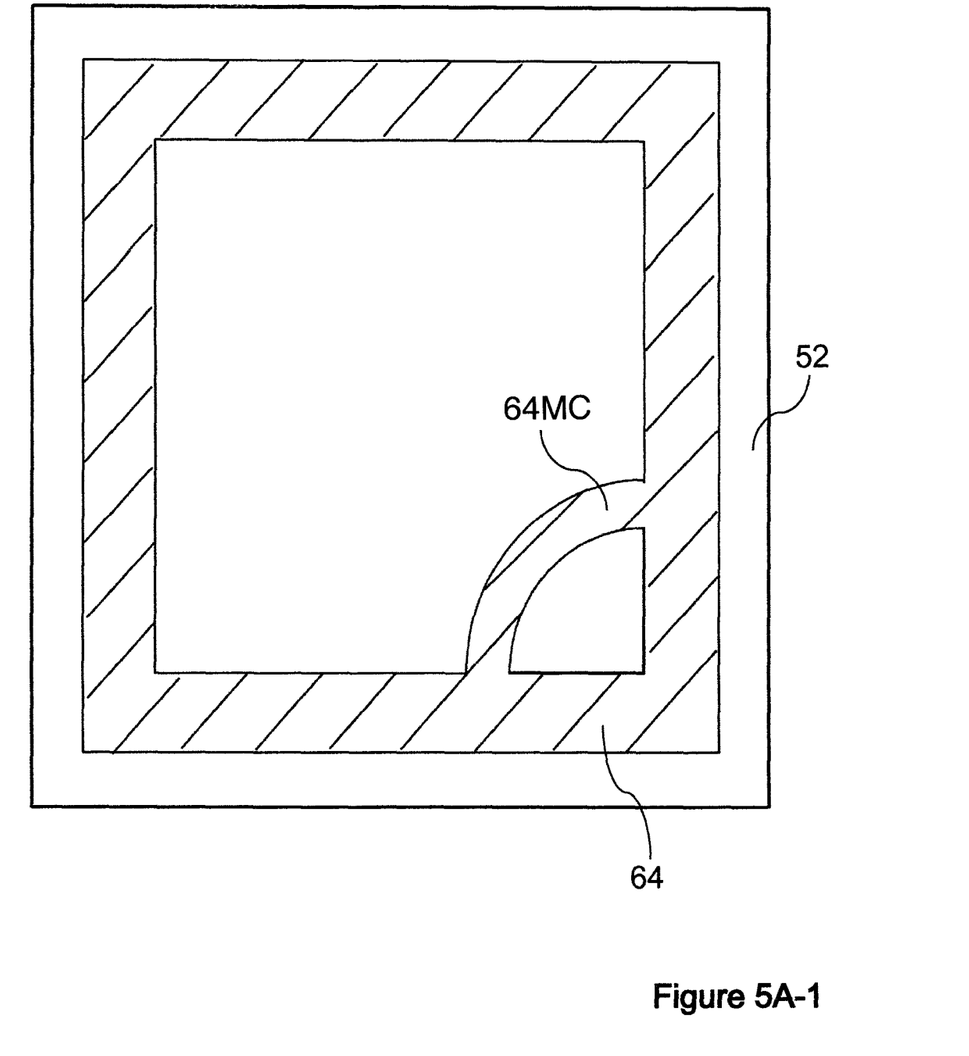

Next as shown in FIG. 4B, the surface isolator structure 64 with its middle segment 64M can be formed on the first semiconductor layer 52. As previously explained, the surface isolator structure 64 has an outline configured to electrically isolate the lens support dam 36 from the bottom surface of the main (VLED) die 32, and also to electrically isolate the lens support dam 36 from the bottom surface of the short circuit (VLED) die 34. FIG. 5A shows the peripheral shape of the surface isolator structure 64 where the cross hatched area represents the surface isolator structure 64 and the middle segment 64M thereof. FIG. 5A-1 illustrates the surface isolator structure 64 with a middle segment 64MC having a curved configuration having a radius of curvature and width, which match these features of the curved conductive via 60C. The surface isolator structure 64 can be formed using a suitable deposition process such as chemical vapor deposition (CVD), plasma enhanced CVD (PECVD), e-beam deposition, atomic layer deposition (ALD), printing or coating. The surface isolator structure 64 can comprise an electrically insulating material, such as an oxide (e.g., $SiO_2$, $TiO_2Al_2O_3$, $HfO_2$, $Ta_2O_5$), a polymer (e.g., epoxy, parylene, polyimide), a nitride (e.g. $Si_3N_4$), a photoresist (e.g., EPON Resin Su-8), or a glass (e.g., BPSG borophosilicate glass).

Figure 4C:
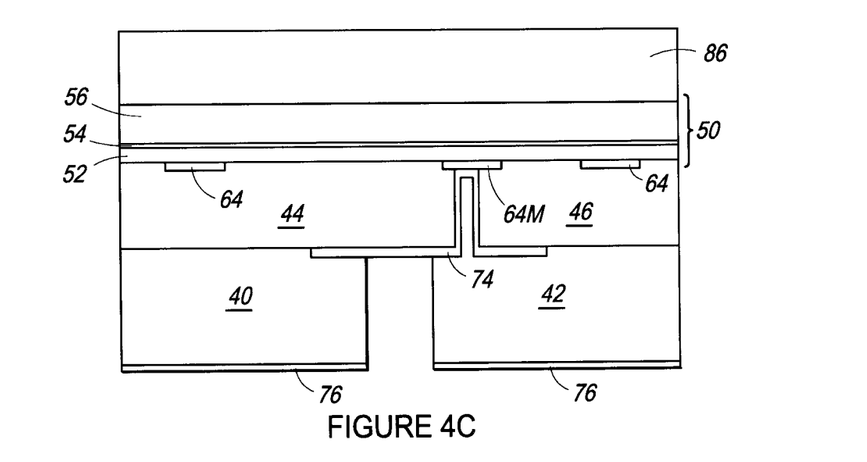

Next as shown in FIG. 4C, the first reflecting layer 44 and the second reflecting layer 46 can be formed on the first semiconductor layer 52. The first reflecting layer 44 and the second reflecting layer 46 can comprise a metal alloy, a metallic material or a metal stack, such as at least two metals selected from the group consisting of Cu, Ni, Al, Sn, Co, Ag, W, V, Au, Pd, Pt, Ti, Rh, TaN, TiW, Cr, Mo, NiV, Cu—Cu, Cu—W, Cu—Mo and alloys thereof. The first reflecting layer 44 and the second reflecting layer 46 can be formed using a suitable deposition process such as sputtering, PVD, e-beam deposition, thermal deposition, electroplating, electroless plating or printing.

As also shown in FIG. 4C, the electrode isolator structure 74 can be formed. The electrode isolator structure 74 can be formed by etching a trench having a desired size and shape and then filling it with an electrically insulating material. The electrode isolator structure 74 can be formed using a suitable deposition process such as chemical vapor deposition (CVD), plasma enhanced CVD (PECVD), e-beam deposition, atomic layer deposition (ALD), printing or coating. The electrode isolator structure 74 can comprise an electrically insulating material, such as an oxide (e.g., $SiO_2$, $TiO_2Al_2O_3$, $HfO_2$, $Ta_2O_5$), a polymer (e.g., epoxy, parylene, polyimide), a nitride (e.g. $Si_3N_4$), a photoresist (e.g., EPON Resin Su-8), or a glass (e.g., BPSG borophosilicate glass).

As also shown in FIG. 4C, the first electrode 40 and the second electrode 42 can be formed on the first reflecting layer 44 and the second reflecting layer 46. The first electrode 40 and the second electrode 42 can comprise a metal alloy, a metallic material or a metal stack, such as at least two metals selected from the group consisting of Cu, Ni, Al, Sn, Co, W, Mo, V, Au, Pd, Pt, Ti, Rh, Cu—W, TaN, TiW, Cr, Cu—Mo, NiV and alloys thereof. The first electrode 40 and the second electrode 42 can be formed using a suitable deposition process such as sputtering, PVD, e-beam deposition, thermal deposition, electroplating, electroless plating or printing.

As also shown in FIG. 4C, the protection layer 76 can be formed on the first electrode 40 and the second electrode 42. The protection layer 76 can comprise a metal alloy, a metallic material or a metal stack, such as at least two metals selected from the group consisting of Cu, Ni, Al, Sn, Co, W, Mo, V, Au, Pd, Pt, Ti, Rh, Cu—W, TaN, TiW, Cr, Cu—Mo, NiV, AuSn, SnCu and alloys thereof. The protection layer 76 can be formed using a suitable deposition process such as sputtering, PVD, e-beam deposition, thermal deposition, electroplating, electroless plating or printing.

Figure 4D:
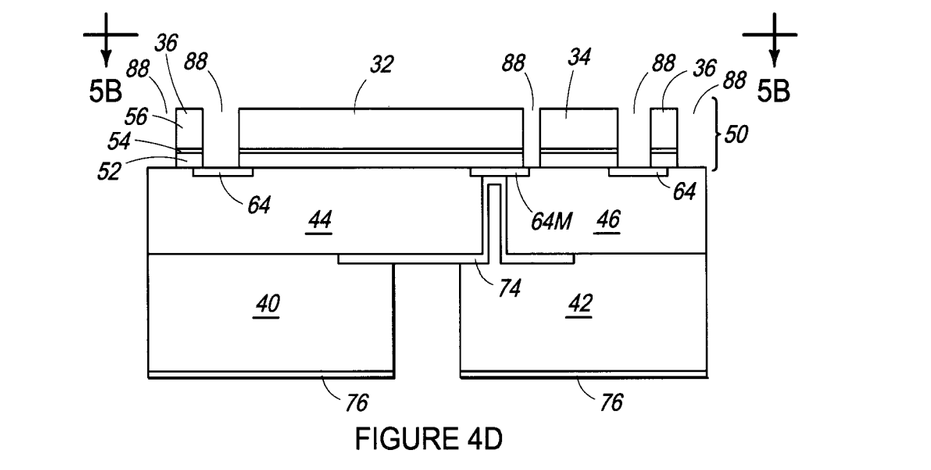
Figure 4E:
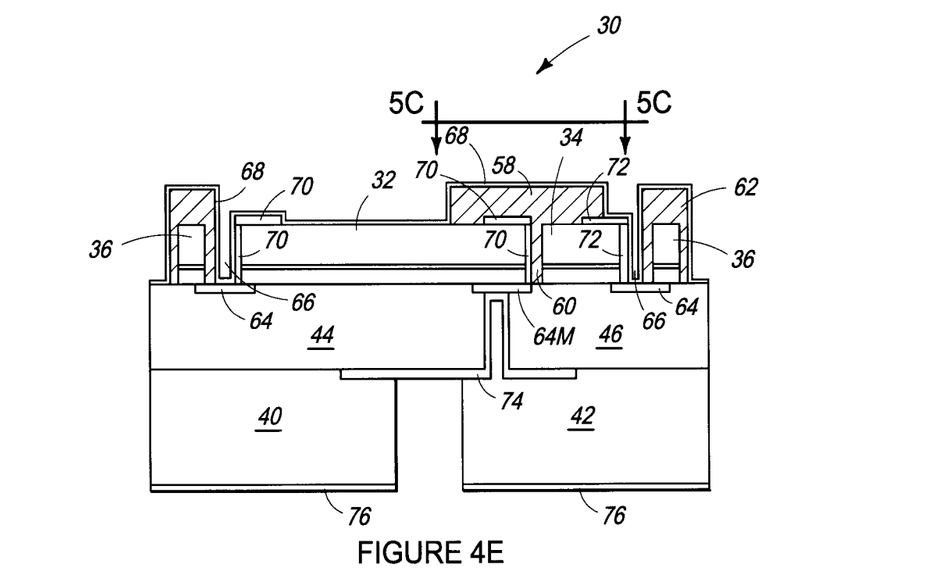
Figure 5B:
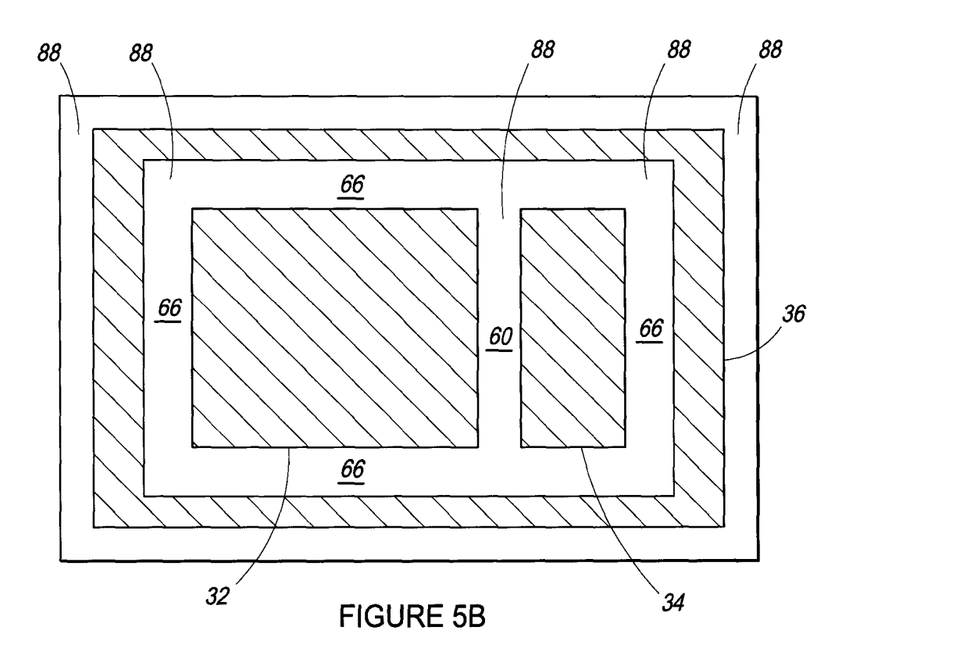
FIG. 5B is an enlarged schematic plan view taken along line 5B-5B of FIG. 4D.
Figure 5B:
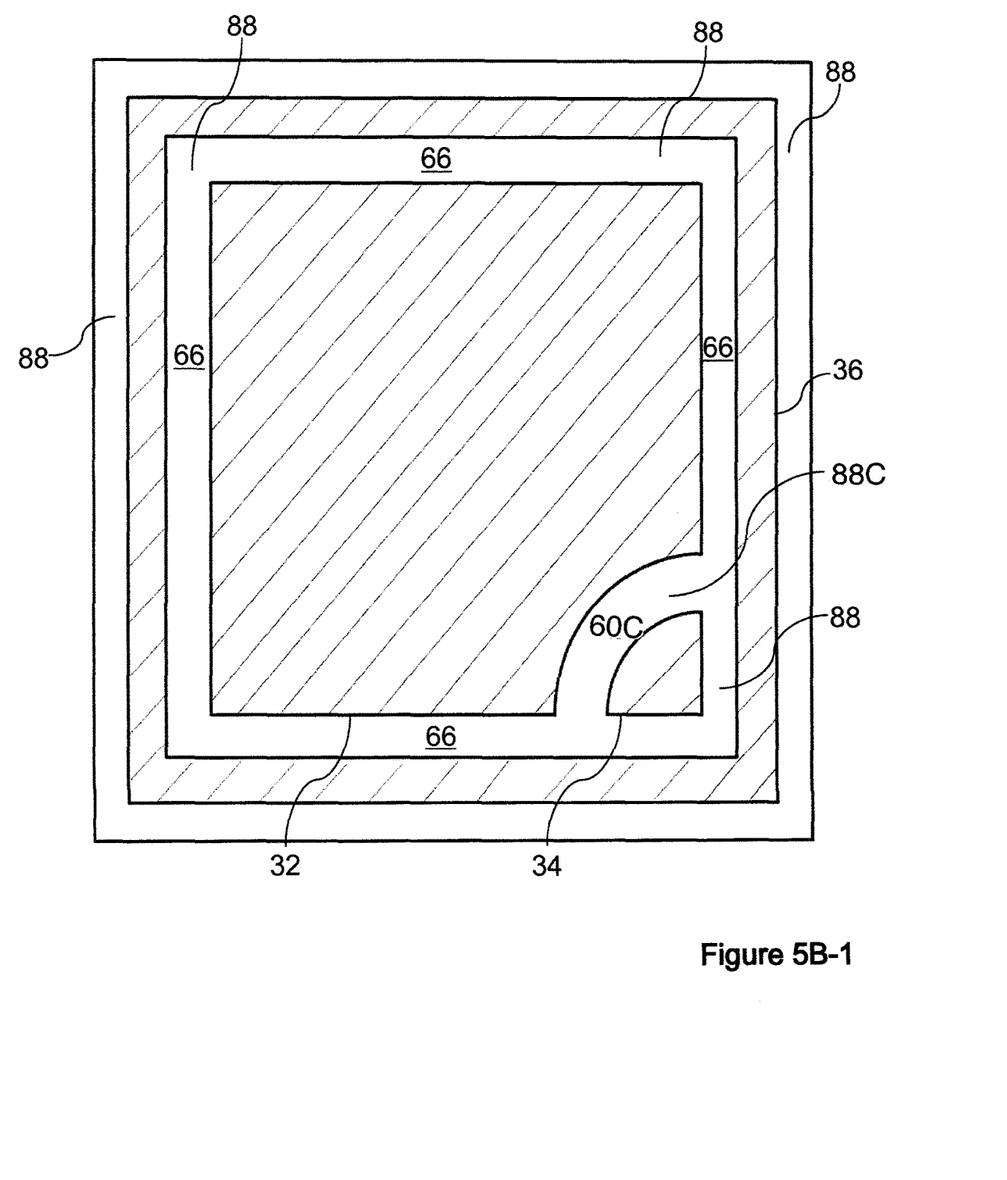

Next as shown in FIG. 4D, the carrier substrate 86 can be removed using a suitable process such a laser pulsing, chemical mechanical planarization (CMP), grinding or etching. As also shown in FIG. 4D, a patterning process can be used to form trenches 88 through the epitaxial stack 50 to define the peripheral shape of the main (VLED) die 32, the short circuit (VLED) die 34, the lens support dam 36 and the spacer via 66. FIG. 5B shows the peripheral shape of these elements, where the cross hatched areas represent the main (VLED) die 32, the short circuit (VLED) die 34, and the lens support dam 36. In FIG. 5B, the picture frame shape of the spacer via 66 between elements is shown without hatching. Also in FIG. 5B, the location of the not yet formed conductive via 60 is shown between the main (VLED) die 32 and the short circuit (VLED) die 34. One suitable patterning process for forming the trenches 88 comprises dry etching through a hard mask. After the etching process, a liquid or a solvent can be used to remove the etch mask, or other protective coating. The trenches 88 also define the size and location of the spacer vias 66 (FIG. 4E). FIG. 5B-1 illustrates the alternate embodiment having a curved conductive via 60C and curved trench 88C.

Next as shown in FIG. 4E, the main (VLED) die isolator structure 70 can be formed on the main (VLED) die 32, and the short circuit (VLED) die isolator structure 72 can be formed on the short circuit (VLED) die 34. The main (VLED) die isolator structure 70 and the short circuit (VLED) die isolator structure 72 can be formed using a suitable deposition process such as chemical vapor deposition (CVD), plasma enhanced CVD (PECVD), e-beam deposition, atomic layer deposition (ALD), printing or coating. In addition, the main (VLED) die isolator structure 70 and the short circuit (VLED) die isolator structure 72 can comprise an electrically insulating material, such as an oxide (e.g., $SiO_2$, $TiO_2Al_2O_3$, $HfO_2$, $Ta_2O_5$), a polymer (e.g., epoxy, parylene, polyimide), a nitride (e.g. $Si_3N_4$), a photoresist (e.g., EPON Resin Su-8), or a glass (e.g., BPSG borophosilicate glass).

Figure 5C:
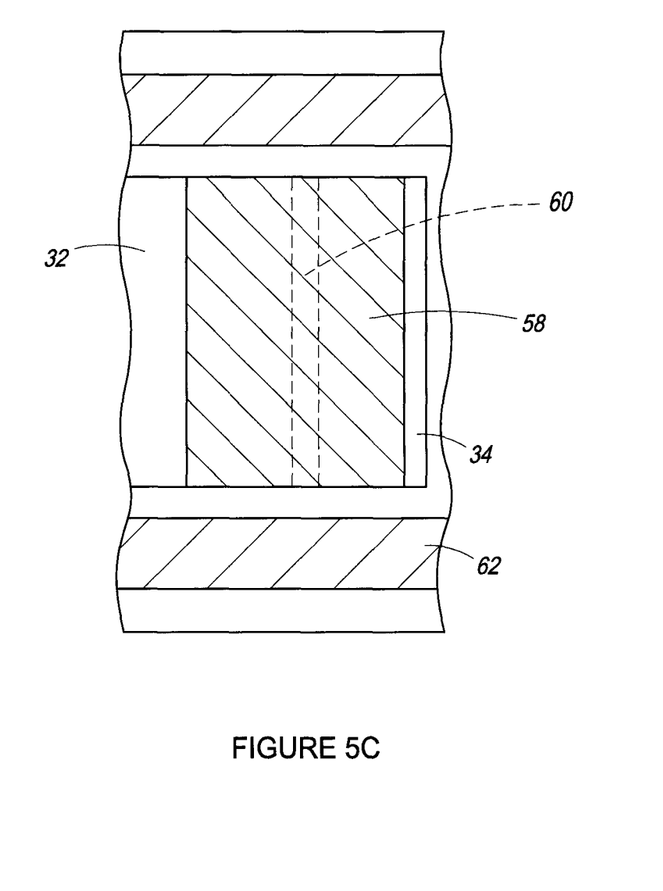
FIG. 5C is an enlarged schematic partial plan view taken along line 5C-5C of FIG. 4E.
Figure 5C:
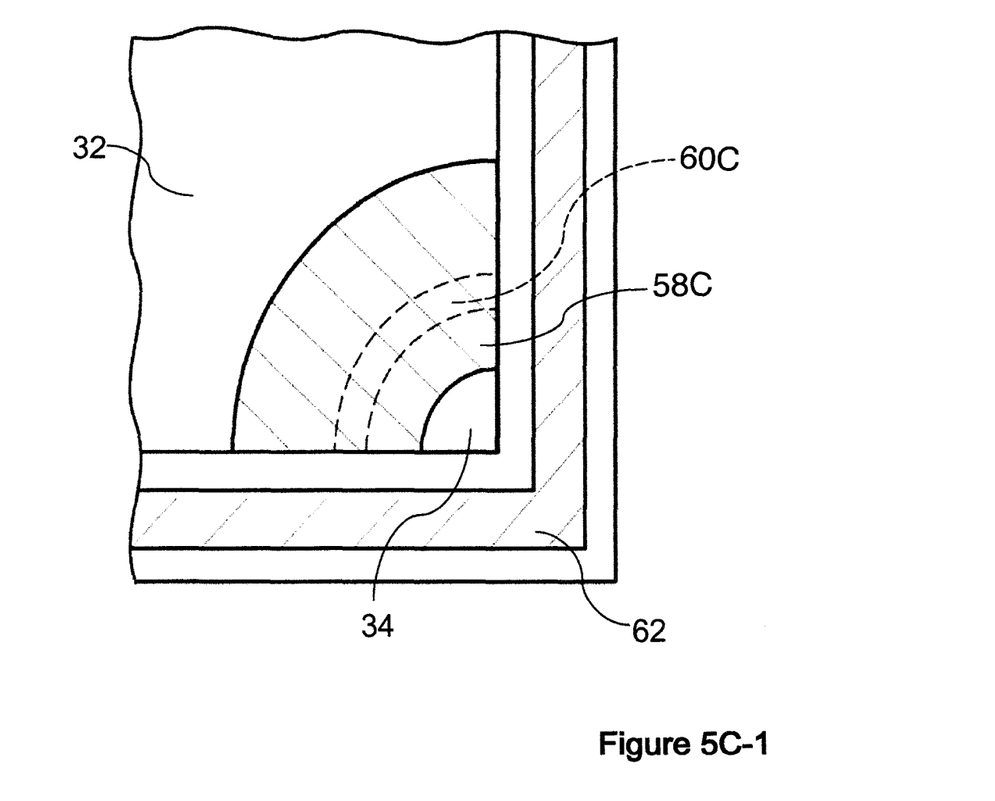

As also shown in FIG. 4E, the conductive via 60, the conductive strap 58 and the lens support metal layer 62 can be formed using the same deposition process. Alternately these elements can be formed using separate deposition processes. The conductive via 60 can be formed in the trench 88 between the main (VLED) die 32 and the short circuit (VLED) die 34. The conductive strap 58 and the lens support metal layer 62 can be sized and shaped as required. FIG. 5C shows the peripheral shape of the conductive strap 58 where the cross hatched area represents the conductive strap 58 located between the main (VLED) die 32 and the short circuit (VLED) die 34 with the conductive via 60 therebetween. In FIG. 5C, the lens support metal layer 62 is also shown in cross hatch. The conductive via 60, the conductive strap 58 and the lens support metal layer 62 can comprise a metal alloy, a metallic material or a metal stack, such as at least two metals selected from the group consisting of Cu, Ni, Al, Sn, Co, W, V, Au, Pd, Pt, Ti, Rh, TaN, TiW, Cr, Mo, NiV and alloys thereof. The conductive via 60, the conductive strap 58 and the lens support metal layer 62 can be formed using a suitable deposition process such as sputtering, PVD, e-beam deposition, thermal deposition, electroplating, electroless plating or printing. FIG. 5C-1 illustrates the alternate embodiment having a curved conductive via 60C and curved conductive strap 58C.

As also shown in FIG. 4E, the passivation layer 68 can be formed on the lens support metal layer 62, on the main (VLED) die 32, on the conductive strap 58 and on the short circuit (VLED) die 34. The passivation layer 68 can be formed using a suitable deposition process such as chemical vapor deposition (CVD), plasma enhanced CVD (PECVD), e-beam deposition, atomic layer deposition (ALD), printing or coating. The passivation layer 68 can comprise an electrically insulating material, such as an oxide (e.g., $SiO_2$, $TiO_2Al_2O_3$, $HfO_2$, $Ta_2O_5$), a polymer (e.g., epoxy, parylene, polyimide), a nitride (e.g. $Si_3N_4$), a photoresist (e.g., EPON Resin Su-8), or a glass (e.g., BPSG borophosphosilicate glass).

Figure 4F:
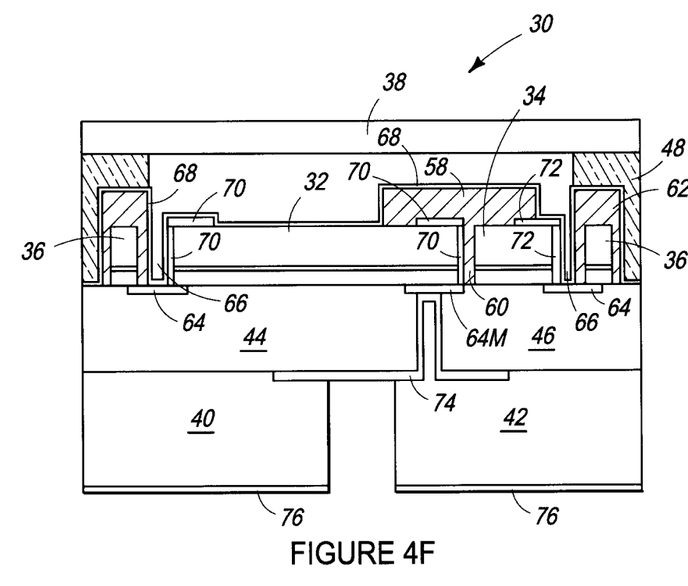

Next as shown in FIG. 4F, the lens 38 can be attached to the lens support metal layer 62 using the adhesion layer 48. The lens can comprise glass, quartz or a patternable film. The adhesion layer 48 can comprise an adhesive such as silicone, epoxy, acrylic, spin-on-glass or a pressure sensitive adhesive (PSA) deposited using a suitable deposition process. In addition, a separating process can be performed using a suitable process such as laser dicing, sawing, breaking, air knifing or water jetting to singulate the individual light emitting diode (LED) packages 30.

While the description has been with reference to certain preferred embodiments, as will be apparent to those skilled in the art, certain changes and modifications can be made without departing from the scope of the following claims.

What is claimed is:

1. A light emitting diode (LED) package comprising: a main vertical LED (VLED) die configured to emit electromagnetic radiation and a short circuit VLED die, each die comprising a first semiconductor layer, a multiple quantum well (MQW) layer, and a second semiconductor layer; a conductive strap and a conductive via configured to electrically connect the second semiconductor layer of the main VLED die to the first semiconductor layer of the short circuit VLED die; a first electrode in electrical communication with the first semiconductor layer of the main VLED die; a second electrode in electrical communication with the second semiconductor layer of the main VLED die; the first electrode and the second electrode located on a same side of the light emitting diode (LED) package; and a lens support dam comprising an epitaxial stack and a transparent lens attached to the lens support dam.

2. The light emitting diode (LED) package of claim 1 further comprising a first reflecting layer between the main VLED die and the first electrode configured to electrically connect the main VLED die to the first electrode, and a second reflecting layer between the short circuit VLED die and the second electrode configured to electrically connect the short circuit VLED die to the second electrode.

3. The light emitting diode (LED) package of claim 2 wherein the first semiconductor layer comprises a p-type confinement layer and the second semiconductor layer comprises an n-type confinement layer.

4. The light emitting diode (LED) package of claim 2 wherein the lens support dam includes a lens support metal layer comprising a same metal layer as the conductive strap.

5. The light emitting diode (LED) package of claim 2 further comprising a passivation layer on the lens support dam, on the main VLED die, on the conductive strap and on the short circuit VLED die.

6. The light emitting diode (LED) package of claim 2 further comprising a main VLED die isolator structure configured to electrically isolate the main VLED die.

7. The light emitting diode (LED) package of claim 2 further comprising a short circuit VLED die isolator structure configured to electrically isolate the short circuit VLED.

8. The light emitting diode (LED) package of claim 2 wherein the lens comprises a material selected from the group consisting of glass and quartz.

9. A light emitting diode (LED) package comprising:
an epitaxial stack comprising a first semiconductor layer, a multiple quantum well (MQW) layer, and a second semiconductor layer;
a main VLED die comprising a first portion of the epitaxial stack configured to emit electromagnetic radiation;
a short circuit VLED die comprising a second portion of the epitaxial stack;
a conductive strap and a conductive via configured to electrically connect the second semiconductor layer of the main VLED die to the first semiconductor layer of the short circuit VLED die;
a lens support dam comprising a third portion of the epitaxial stack surrounding the main VLED die and the short circuit VLED die;
a transparent lens attached to the lens support dam;
a first electrode in electrical communication with the first semiconductor layer of the main VLED die; and
a second electrode in electrical communication with the second semiconductor layer of the main VLED die, the first electrode and the second electrode located on a same side of the light emitting diode (LED) package.

10. The light emitting diode (LED) package of claim 9 wherein the lens support dam includes a lens support metal layer comprising a same metal layer as the conductive strap.

11. The light emitting diode (LED) package of claim 9 wherein the main (VLED) die has a first rectangular shape, the short circuit VLED die has a second rectangular shape, and the lens support dam has a third rectangular shape.

12. The light emitting diode (LED) package of claim 9 further comprising a first reflecting layer between the main VLED die and the first electrode configured to electrically connect the main VLED die to the first electrode, and a second reflecting layer between the short circuit VLED die and the second electrode configured to electrically connect the short circuit VLED die to the second electrode.

13. A light emitting diode (LED) system comprising:
a board having a plurality of electrode pads;
a light emitting diode (LED) package flip chip mounted to the board, the (LED) package comprising:
an epitaxial stack comprising a first semiconductor layer, a multiple quantum well (MQW) layer, and a second semiconductor layer;
a main VLED die comprising a first portion of the epitaxial stack configured to emit electromagnetic radiation;
a short circuit VLED die comprising a second portion of the epitaxial stack;
a conductive strap and a conductive via configured to electrically connect the second semiconductor layer of the main VLED die to the first semiconductor layer of the short circuit VLED die;
a lens support dam comprising a third portion of the epitaxial stack surrounding the main VLED die and the short circuit VLED die;
a transparent lens attached to the lens support dam;
a first electrode in electrical communication with the first semiconductor layer of the main VLED die; and
a second electrode in electrical communication with the second semiconductor layer of the main VLED die, the first electrode and the second electrode located on a same side of the light emitting diode VLED package and bonded to the electrode pads on the board.

* * * * *